(12) United States Patent
Lee et al.

(10) Patent No.: US 10,191,807 B2
(45) Date of Patent: Jan. 29, 2019

(54) MEMORY SYSTEMS AND OPERATION METHOD THEREOF

(71) Applicant: SK hynix Inc., Icheon-si, Gyeonggi-do (KR)

(72) Inventors: Sung-Eun Lee, Icheon-si (KR); Jung-Hyun Kwon, Seoul (KR); Sang-Gu Jo, Bucheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 9 days.

(21) Appl. No.: 15/644,132

(22) Filed: Jul. 7, 2017

(65) Prior Publication Data

US 2018/0129565 A1 May 10, 2018

(30) Foreign Application Priority Data

Nov. 9, 2016 (KR) .................... 10-2016-0148837

(51) Int. Cl.
*G06F 11/10* (2006.01)
*H03M 13/15* (2006.01)
*H03M 13/19* (2006.01)
*H03M 13/29* (2006.01)

(52) U.S. Cl.
CPC ...... *G06F 11/1076* (2013.01); *G06F 11/1012* (2013.01); *H03M 13/152* (2013.01); *H03M 13/19* (2013.01); *H03M 13/2906* (2013.01)

(58) Field of Classification Search
CPC ........... G06F 11/1076; G06F 11/1012; H03M 13/152; H03M 13/19; H03M 13/2906

USPC ....... 714/704, 753, 758, 766, 768, 773, 777, 714/782, 799
See application file for complete search history.

(56) References Cited

U.S. PATENT DOCUMENTS

| | | | |
|---|---|---|---|
| 7,562,283 B2 | 7/2009 | Falik et al. | |
| 8,086,933 B2* | 12/2011 | Yamaga | G06F 11/1012 714/755 |
| 8,312,348 B2* | 11/2012 | Yamaga | G06F 11/1068 714/768 |
| 8,381,066 B2* | 2/2013 | Yamaga | G06F 11/1012 714/755 |
| 8,418,028 B2* | 4/2013 | Yamaga | G06F 11/1068 714/763 |
| 8,898,541 B2* | 11/2014 | Okubo | G06F 11/1048 714/755 |
| 2008/0148132 A1* | 6/2008 | Mavila | G06F 11/1068 714/779 |
| 2009/0222708 A1* | 9/2009 | Yamaga | G06F 11/1068 714/773 |
| 2010/0313099 A1* | 12/2010 | Yamaga | G06F 11/1012 714/755 |

(Continued)

*Primary Examiner* — John J Tabone, Jr.
(74) *Attorney, Agent, or Firm* — William Park & Associates Ltd.

(57) ABSTRACT

The memory system includes a BCH error correction circuit suitable for generating a BCH error correction code using a first write data which is a portion of a write data from a host, a Hamming error correction circuit suitable for generating a Hamming error correction code using a second write data which is a remaining portion of the write data, a plurality of first memory devices suitable for storing first write data and the BCH error correction code, and one or more second memory devices suitable for storing the second write data and the Hamming error correction code.

20 Claims, 3 Drawing Sheets

(56) References Cited

U.S. PATENT DOCUMENTS

| | | | |
|---|---|---|---|
| 2011/0047441 A1* | 2/2011 | Yamaga | G06F 11/1068 714/773 |
| 2012/0072801 A1* | 3/2012 | Takeuchi | G06F 1/3203 714/755 |
| 2012/0151294 A1* | 6/2012 | Yoo | G06F 11/1012 714/755 |
| 2013/0139030 A1* | 5/2013 | Okubo | G06F 11/1048 714/755 |
| 2014/0122974 A1* | 5/2014 | Yun | G06F 11/1004 714/773 |
| 2017/0046225 A1* | 2/2017 | Yang | G11C 7/1006 |
| 2017/0249210 A1* | 8/2017 | Oyamatsu | G06F 11/1068 |

* cited by examiner

MEMORY SYSTEMS AND OPERATION METHOD THEREOF

CROSS-REFERENCE TO RELATED APPLICATIONS

The present application claims priority to Korean Patent Application No. 10-2016-0148837, filed on Nov. 9, 2016, which is incorporated herein by reference in its entirety.

BACKGROUND

1. Technical Field

Exemplary embodiments of the present disclosure relate to a memory system.

2. Description of the Related Art

In the early days of the semiconductor memory industry, a good number of original good dies, each of which has no defective memory cells in a manufactured memory chip, are distributed in a wafer. However, as the capacity of a memory device increases, it becomes difficult to manufacture a memory device without any defective memory cells. Accordingly, it seems that there is no chance to manufacture such a memory device nowadays.

As one way which has been proposed to overcome this concern is a method of using redundancy memory cells to repair a defective memory cell.

As another way of overcoming this concern is using an error correction code (ECC) circuit which corrects an error in a memory cell or an error occurring in a data transfer which may occur during read and write operations.

SUMMARY

Various embodiments of the present disclosure are directed to enhancement of error correction capability of a memory system.

In accordance with an embodiment of the present disclosure, the memory system may include: a BCH error correction circuit suitable for generating a BCH error correction code using a first write data which is a portion of a write data from a host; a Hamming error correction circuit suitable for generating a Hamming error correction code using a second write data which is a remaining portion of the write data; a plurality of first memory devices suitable for storing the first write data and the BCH error correction code; and one or more second memory devices suitable for storing the second write data and the Hamming error correction code.

In accordance with an embodiment of the present disclosure, a memory system may include: a BCH error correction circuit suitable for generating a BCH error correction code using a first write data which is a portion of a 512-bit write data from a host; a Hamming error correction circuit suitable for generating a Hamming error correction code using a second write data which is the remaining portion of the 512-bit write data; eight first memory devices suitable for storing the first write data and the BCH error correction code; and a second memory device suitable for storing the second write data and the Hamming error correction code.

In accordance with an embodiment of the present disclosure, the memory system may include: a memory controller including a first-type error correction circuit suitable for generating a first error correction code using a first write data which is a portion of a write data form a host, and a second-type error correction circuit suitable for generating a second error correction code using a second write data which is the remaining portion of the write data, wherein error correction algorithms used by the first-type error correction circuit and the second-type error correction circuit are different from each other; and a memory module including a plurality of first memory devices suitable for storing the first write data and the first error correction code, and one or more second memory device suitable for storing the second write data and the second error correction code.

DETAILED DESCRIPTION

Figure 1:
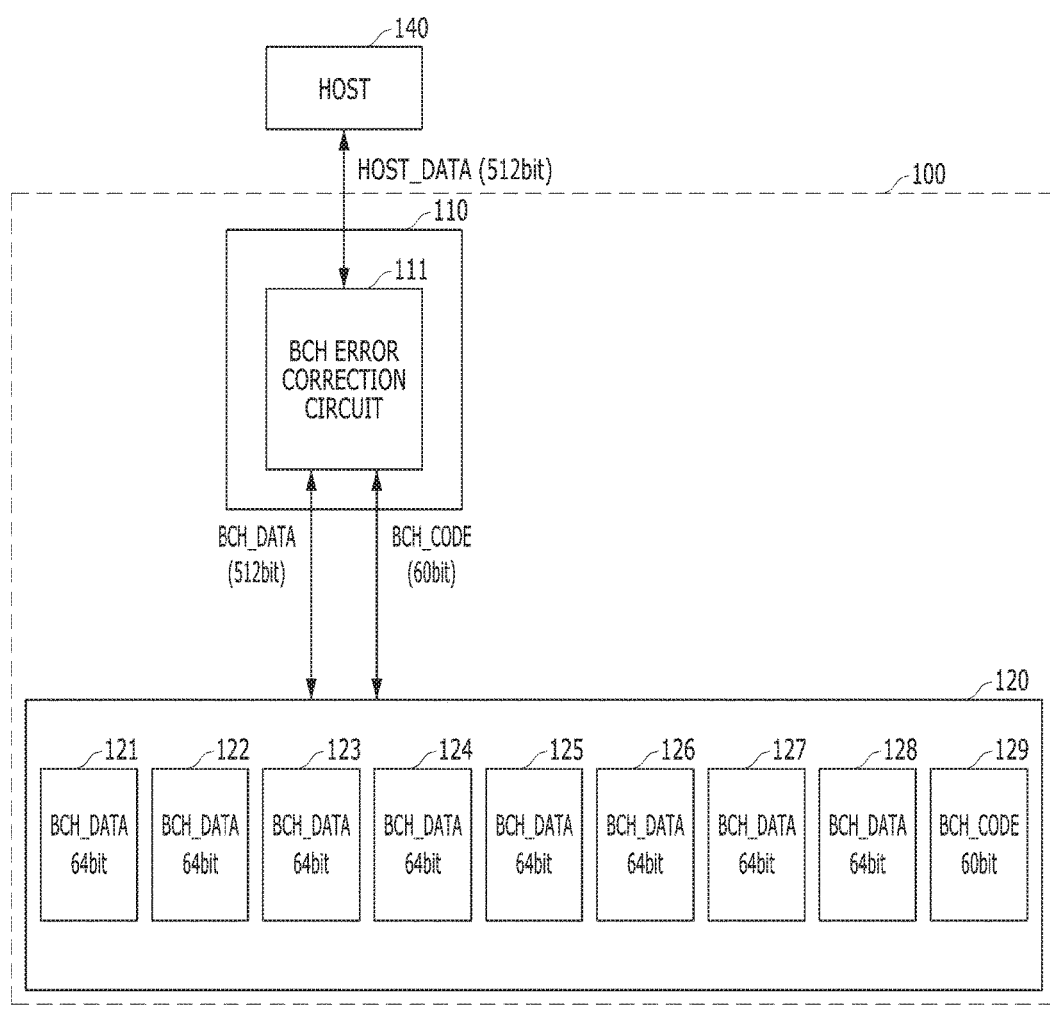
FIG. 1 is a block diagram of a memory system according to a first embodiment of the present disclosure.

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

FIG. 1 is a block diagram of a memory system 100 according to a first embodiment of the present disclosure. FIG. 1 shows only a portion directly related to data transfer in the memory system 100.

Referring to FIG. 1, the memory system 100 may include a memory controller 110 and a memory module 120. The memory controller 110 may control operations of the memory module 120 according to a request from a host 140 including read and write operations. The memory controller 110 may include a BCH error correction circuit 111. Conventionally, a Hamming error correction algorithm has been widely used. However, as a bit error rate (BER) of memory devices 121 to 129 included in the memory module 120 increases, the BCH error correction circuit 111 may use the BCH error correction algorithm having a higher error correction capability than the Hamming error correction algorithm.

During the write operation, the BCH error correction circuit 111 may generate a BCH error correction code BCH_CODE using read or write data HOST_DATA, in this case a write data HOST_DATA, from a host 140. Regarding the write data BCH_DATA, _BCH means that the write data BCH_DATA is matched to the BCH error correction code BCH_CODE. The write data BCH_DATA and the write data HOST_DATA from the host 140 may be the same as each other during the write operation.

During the read operation, the BCH error correction circuit 111 may correct errors in the read data BCH_DATA read from the memory module 120, by using the BCH error correction code and transferring the error corrected (BCH ECC decoded) read data HOST_DATA to the host 140.

A codeword represents a sum of the BCH error correction code BCH_CODE and corresponding data BCH_DATA. That is, the codeword=BCH_CODE+BCH_DATA. According to the BCH error correction algorithm, a size "n" of the codeword is determined according to the value of "m" in the Galois field "$2^m$", where $n \leq 2^{m-1}$. The maximum size "n" of the codeword is 511 bits when m=9, and the maximum size "n" of the codeword is 1023 bits when m=10. When a size of error bits to be corrected is "t" bits, a required size of the BCH error correction code BCH_CODE is "m*t" bits. That is, the size "n" of the codeword may be a sum of the size of the BCH ECC-encoded host data BCH_DATA and the required size of the BCH error correction code BCH_CODE (i.e., the "m*t" bits).

A unit size of data processed in the memory system 100 is 512 bits. That is, a size of the data HOST_DATA transferred between the host 140 and the memory controller 110 is 512 bits. In this case, the value of "m" should be 10 because the size "n" of the codeword is bigger than 511 bits. Therefore, the size of the BCH error correction code BCH_CODE to correct 6-bit errors (i.e., t=6) is 60 bits (m*t=10*6). As a result, when the size of the data HOST_DATA is 512 bits, the size of the data BCH_DATA is 512 bits and the size of the BCH error correction code BCH_CODE is 60 bits.

For example, the memory module 120 may include nine memory devices 121 to 129. The memory devices 121 to 129 may be any one of all kinds of memories including the DRAM, phase change random access memory (PCRAM), and flash memory. The memory module 120 may be a dual in-line memory module (DIMM) type.

A unit size of data stored into and read from each of the nine memory devices 121 to 129 may be 64 bits. The eight 64-bit portions divided from the 512-bit data BCH_DATA may be stored into eight memory devices 121 to 128, respectively. And the 60-bit BCH error correction code BCH_CODE may be stored into the ninth remaining memory device 129. Remaining 4 bits of the memory device 129 may be zero-padded. FIG. 1 shows data stored in the respective memory devices 121 to 129.

The memory system 100 may have error correction capability for correcting 6-bit errors of the 512-bit data BCH_DATA by using the 60-bit BCH error correction code BCH_CODE.

Figure 2:
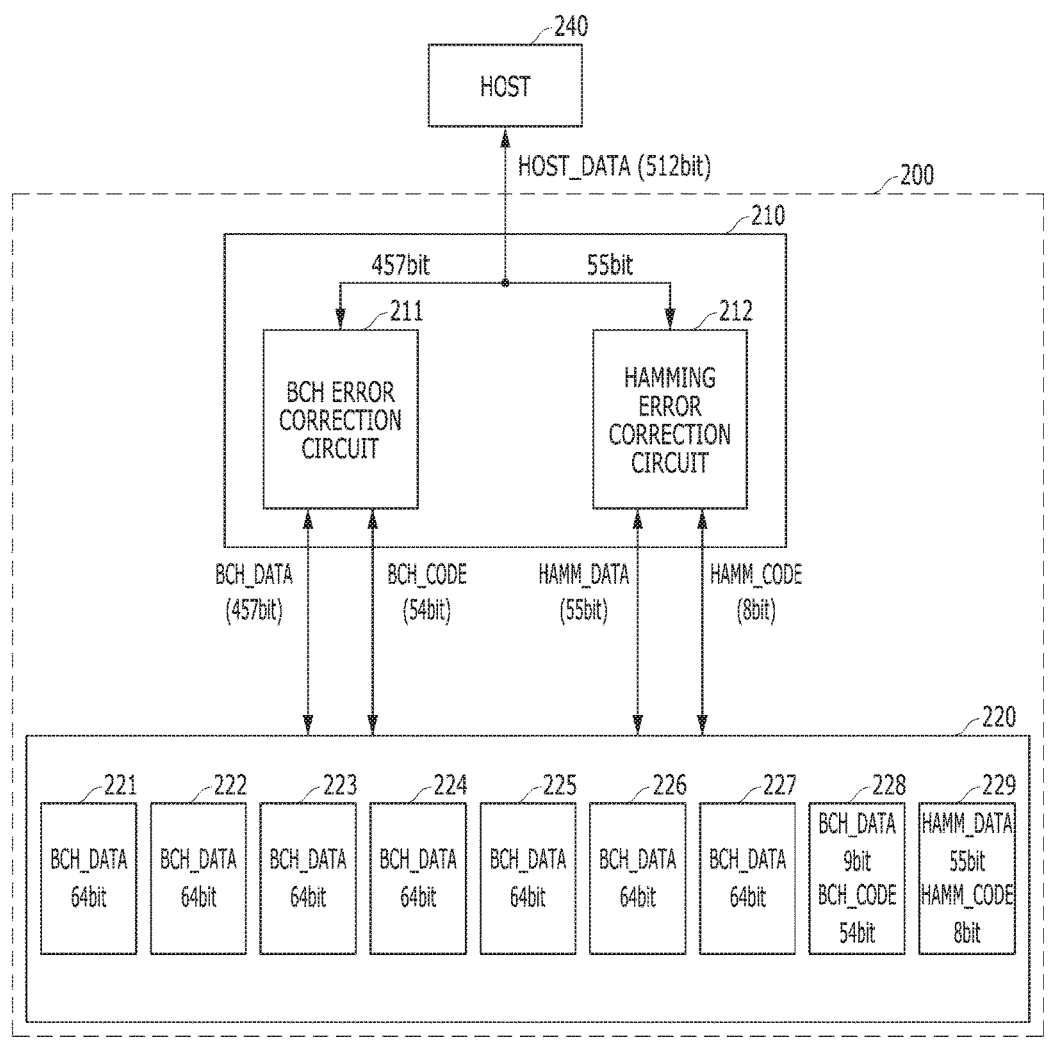
FIG. 2 is a block diagram of a memory system according to a second embodiment of the present disclosure.

FIG. 2 is a block diagram of a memory system 200 according to a second embodiment of the present disclosure. FIG. 2 shows only a portion directly related to data transfer in the memory system 200. The memory system 200 may have higher error correction capability than the memory system 100 as will be described.

Referring to FIG. 2, the memory system 200 may include a memory controller 210 and a memory module 220. The memory controller 210 may control operations of the memory module 220 including read and write operations according to a request from a host 240. The memory controller 210 may include a BCH error correction circuit 211 and a Hamming error correction circuit 212. As previously described, the BCH error correction circuit 211 may use a BCH error correction algorithm and the Hamming error correction circuit 212 may use a Hamming error correction algorithm.

During the write operation, write data HOST_DATA from a host 240 may be divided into first and second portions and the first and second portions may be transferred to the BCH error correction circuit 211 and the Hamming error correction circuit 212, respectively. For example, when a size of the write data HOST_DATA transferred between the host 240 and the memory controller 210 is 512 bits, sizes of the first and second portions may be 457 and 55 bits, respectively, which will be described later. Hereinafter, the first portion of the write data HOST_DATA is referred to as a first write data and the second portion of the write data HOST_DATA is referred to as a second write data.

The BCH error correction circuit 211 may generate a BCH error correction code BCH_CODE using the first write data. Regarding first write data BCH_DATA, BCH_ means that the first write data BCH_DATA is matched to the BCH error correction code BCH_CODE. The first write data BCH_DATA and the first portion of the write data HOST_DATA may be the same as each other during the write operation.

During a read operation, the BCH error correction circuit 211 may decode and correct errors in a first read data BCH_DATA read from memory devices 221 to 228 of the memory module 220, by using the BCH error correction code BCH_CODE read from the memory devices 221 to 228 and transfers the error corrected (BCH ECC-decoded) first read data (first portion of HOST_DATA) to the host 240.

A codeword means a sum of BCH error correction code BCH_CODE and corresponding data BCH_DATA. That is, the codeword=BCH_CODE+BCH_DATA. According to the BCH error correction algorithm, a size "n" of the codeword is determined according to the value of "m" in the Galois field "$2^m$", where $n \leq 2^{m-1}$.

The maximum size "n" of the codeword is 511 bits when m=9, and the maximum size "n" of the codeword is 1023 bits when m=10. When a size of error bits to be corrected is "t" bits, a required size of the BCH error correction code BCH_CODE is "m*t" bits. That is, the size "n" of the codeword may be a sum of the size of the BCH ECC-encoded host data BCH_DATA and the required size of the BCH error correction code BCH_CODE (i.e., the "m*t" bits).

The BCH error correction circuit 211 may limit the size of the BCH codeword to 511 bits or less and maintain the value "m" to 9 to keep the size of the BCH error correction code BCH_CODE small. That is, the BCH error correction circuit 211 having a 6-bit error correction capability (i.e., t=6) may process the 512-bit BCH codeword that is a sum of the 457-bit first data BCH_DATA and the 54-bit (=m*t=9*6) BCH error correction code BCH_CODE. The BCH error correction circuit 211 may have error correction capability for correcting 6-bit errors in the 457-bit BCH_DATA by using the 54-bit BCH_CODE.

The Hamming error correction circuit 212 may generate a Hamming error correction code HAMM_CODE using the second write data. Regarding a second write data HAMM_DATA, HAMM_ means that the second write data HAMM_DATA is matched to the Hamming error correction code HAMM_CODE. The second write data HAMM_DATA and the second portion of the write data HOST_DATA may be the same as each other during the write operation.

During a read operation, the Hamming error correction circuit 212 may decode and correct errors in a second read data HAMM_DATA, which is read from memory device 229 of the memory module 220, by using the Hamming error correction code HAMM_CODE read from the memory device 229 and transfers the error corrected (Hamming ECC-decoded) second read data (second portion of HOST_DATA) to the host 240.

As described above, the first data BCH_DATA may be 457 bits and thus the second data HAMM_DATA may be 55 bits since the total data HOST_DATA is 512 bits. The Hamming error correction code HAMM_CODE may be 7 or 8 bits. When the HAMM_CODE is 7 bits, a 1 bit error in the 55-bit HAMM_DATA may be detected and corrected. And when the HAMM_CODE is 8 bits, 2 bit errors in the 55-bit HAMM_DATA may be detected and a 1 bit error in the 55-bit HAMM_DATA may be corrected. FIG. 2 exemplarily shows the 8-bit Hamming error correction code HAMM_CODE.

The memory module 220 may include nine memory devices 221 to 229. The memory devices 221 to 229 may be any one of all kinds of memories including DRAM, phase change random access memory (PCRAM), and flash memory. The memory module 220 may be a dual in-line memory module (DIMM) type.

A unit size of data stored into and read from each of the nine memory devices 221 to 229 may be 64 bits. The 457-bit first data BCH_DATA and the 54-bit BCH error correction code BCH_CODE may be stored into eight memory devices 221 to 228. The 55-bit second data HAMM_DATA and the 8-bit Hamming error correction code HAMM_CODE may be stored into memory device 229. The remaining 1-bit of the memory device 228 and the remaining 1-bit of the memory device 229 may be zero padded. FIG. 2 shows information stored in the respective memory devices 221 to 229.

The memory system 200 may have error correction capability for correcting 6-bit errors of the 457-bit first read data BCH_DATA read from the eight memory devices 221 to 228 and 1-bit of error correction capability of the 55-bit second read data HAMM_DATA read from the memory device 229 respectively by using the 54-bit BCH error correction code BCH_CODE and the 8-bit Hamming error correction code HAMM_CODE. The memory system 200 may have higher error correction capability than the 6-bit error correction capability of the memory system 100.

However, because the memory system 200 cannot correct two or more errors of the 55-bit second read data HAMM_DATA read from the memory device 229, it is preferred that the memory device 229 has a lower bit error rate (BER) than the memory devices 221 to 228. For example, it is preferred that the memory device 229 has the best test result among the nine memory devices while manufacturing the memory module 220.

Although the BCH error correction circuit 211 and the Hamming error correction circuit 212 are included in the memory controller 210 in FIG. 2, one or more of the circuits 211, 212 may be included in the memory module 220. And the number of memory devices 221 to 229 included in the memory module 220 and data to be stored therein may vary according to system design.

Figure 3:
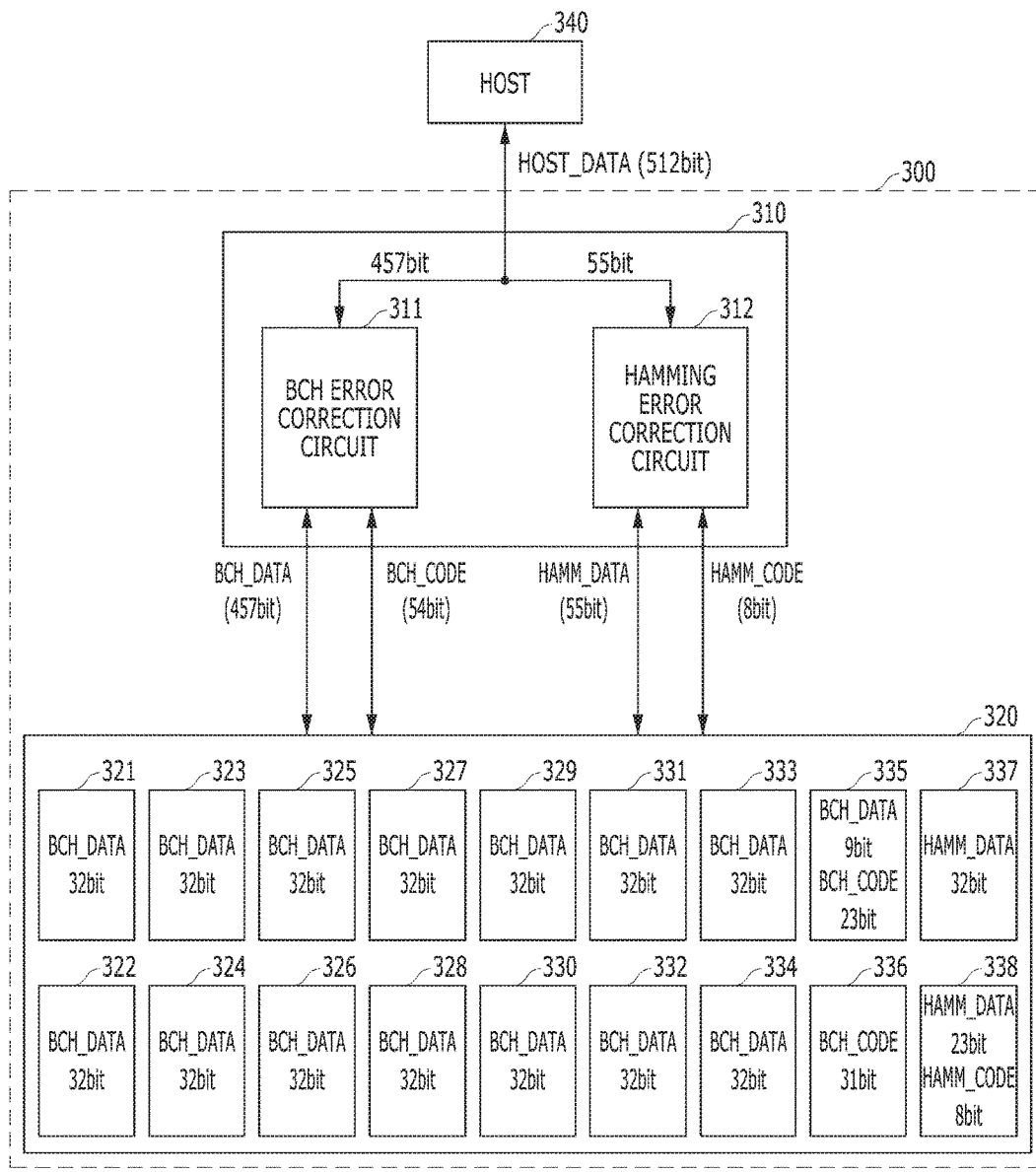
FIG. 3 is a block diagram of a memory system according to a third embodiment of the present disclosure.

FIG. 3 is a block diagram of a memory system 300 according to a third embodiment of the present disclosure. FIG. 3 shows only a portion directly related to data transfer in the memory system 300. The memory systems 200 and 300 of FIGS. 2 and 3 may be the same except for a number of memory devices included in the memory module. The memory system 300 may include a memory controller 310 in communication with a host 340 and a memory module 320. As previously described, the BCH error correction circuit 311 may use a BCH error correction algorithm and the Hamming error correction circuit 312 may use a Hamming error correction algorithm.

The memory module 320 may include eighteen memory devices 321 to 338. The memory devices 321 to 338 may be any one of all kinds of memories including DRAM, phase change random access memory (PCRAM), and flash memory. The memory module 320 may be a dual in-line memory module (DIMM) type.

A unit size of data stored into and read from each of the eighteen memory devices 321 to 338 may be 32 bits. The 448-bit data including fourteen 32-bit portions divided from the 457-bit first data BCH_DATA may be stored into the fourteen memory devices 321 to 334, respectively. The 32-bit data including remaining 9-bit portion divided from the 457-bit first data BCH_DATA and a 23-bit portion divided from the 54-bit BCH error correction code BCH_CODE may be stored into one (e.g., the memory device 335) of the remaining four memory devices 335 to 338. The 32-bit data including remaining 31-bit portion of the 54-bit BCH error correction code BCH_CODE and a zero-padded 1 bit may be stored into another (e.g., the memory device 336) of the remaining four memory devices 335 to 338. The 32-bit portion divided from the 55-bit second data HAMM_DATA may be stored into another one (e.g., the memory device 337) of the memory devices 335 to 338. And the 32-bit data including remaining 23-bit portion divided from the 55-bit second data HAMM_DATA, the 8-bit Hamming error correction code HAMM_CODE and a zero-padded 1 bit may be stored into another one (e.g., the memory device 338) of the memory devices 335 to 338. FIG. 3 shows information stored in the respective memory devices 321 to 338.

Because the memory system 300 cannot correct two or more errors of the 55-bit second data HAMM_DATA read from the memory devices 337 and 338, it is preferred that the memory devices 337 and 338 have a lower bit error rate (BER) than the memory devices 321 to 336.

The number of memory devices 321 to 338 included in the memory module 320 and data to be stored therein may vary according to system design.

Although various embodiments have been described for illustrative purposes, it will be apparent to those skilled in the art that various changes and modifications may be made without departing from the spirit and scope of the disclosure as defined in the following claims.

What is claimed is:

1. A memory system, comprising:
 a BCH error correction circuit suitable for generating a BCH error correction code using a first write data which is a portion of a write data from a host;
 a Hamming error correction circuit suitable for generating a Hamming error correction code using a second write data which is a remaining portion of the write data;
 a plurality of first memory devices suitable for storing the first write data and the BCH error correction code; and
 one or more second memory devices suitable for storing the second write data and the Hamming error correction code.

2. The memory system of claim 1, wherein the second memory devices have a lower bit error rate (BER) than the first memory devices.

3. The memory system of claim 1,
 wherein a size of the write data is 512 bits,
 wherein a total size of the first write data and the BCH error correction code is less than or equal to 511 bits, and
 wherein a total size of the second write data and the Hamming error correction code is less than 64 bits.

4. The memory system of claim 3,
 wherein a size of the first write data is 457 bits, and
 wherein a size of the BCH error correction code is 54 bits.

5. The memory system of claim 4,
 wherein a size of the second write data is 55 bits, and
 wherein a size of the Hamming error correction code is 7 or 8 bits.

6. The memory system of claim 1,
 wherein the BCH error correction circuit further BCH ECC-decodes a first read data read from the first memory devices using the BCH error correction code read from the first memory devices, wherein the Hamming error correction circuit further Hamming ECC-decodes a second read data read from the second memory devices using the Hamming error correction code read from the second memory devices, and wherein the BCH ECC-decoded first read data and the Hamming ECC-decoded second data are provided to the host as a read data.

7. The memory system of claim 1, wherein the BCH error correction circuit and the Hamming error correction circuit are included in a memory controller, and wherein the first memory devices and the second memory devices are included in a memory module.

8. A memory system, comprising:

a BCH error correction circuit suitable for generating a BCH error correction code using a first write data which is a portion of a 512-bit write data from a host;

a Hamming error correction circuit suitable for generating a Hamming error correction code using a second write data which is a remaining portion of the 512-bit write data;

eight first memory devices suitable for storing the first write data and the BCH error correction code; and a second memory device suitable for storing the second write data and the Hamming error correction code.

9. The memory system of claim 8, wherein the second memory device has a lower bit error rate (BER) than the first memory devices.

10. The memory system of claim 8, wherein a total size of the first write data and the BCH error correction code is less than or equal to 511 bits, and wherein a total size of the second write data and the Hamming error correction code is less than 64 bits.

11. The memory system of claim 10, wherein a size of the first data is 457 bits, wherein a size of the BCH error correction code is 54 bits, wherein a size of the second data is 55 bits, and wherein a size of the Hamming error correction code is 7 or 8 bits.

12. The memory system of claim 8, wherein the BCH error correction circuit further BCH ECC-decodes a first read data read from the first memory devices using the BCH error correction code read from the first memory devices, wherein the Hamming error correction circuit further Hamming ECC-decodes a second read data read from the second memory device using the Hamming error correction code read from the second memory device, and wherein the BCH ECC-decoded first read data and the Hamming ECC-decoded second read data are provided to the host as a 512-bit read data.

13. The memory system of claim 8, wherein the BCH error correction circuit and the Hamming error correction circuit are included in a memory controller, and wherein the first memory devices and the second memory device are included in a memory module.

14. A memory system, comprising:

a memory controller including a first-type error correction circuit suitable for generating a first error correction code using a first write data which is a portion of a write data form a host, and a second-type error correction circuit suitable for generating a second error correction code using a second write data which is a remaining portion of the write data, wherein error correction algorithms used by the first-type error correction circuit and the second-type error correction circuit are different from each other; and a memory module including a plurality of first memory devices suitable for storing the first write data and the first error correction code, and one or more second memory device suitable for storing the second write data and the second error correction code.

15. The memory system of claim 14, wherein the first-type error correction circuit uses a BCH error correction algorithm, and wherein the second-type error correction circuit uses a Hamming error correction algorithm.

16. The memory system of claim 15, wherein the second memory device has a lower bit error rate (BER) than the first memory devices.

17. The memory system of claim 15, wherein a size of the write data is 512 bits, wherein a total size of the first write data and the first error correction code is less than or equal to 511 bits, and wherein a total size of the second write data and the second error correction code is less than 64 bits.

18. The memory system of claim 17, wherein a size of the first write data is 457 bits, and wherein a size of the first error correction code is 54 bits.

19. The memory system of claim 18, wherein a size of the second write data is 55 bits, and wherein a size of the second error correction code is 7 or 8 bits.

20. The memory system of claim 14, wherein the memory module includes eighteen memory devices, where fourteen memory devices are configured to receive the first write data and four memory devices are configured to receive the second write data.

* * * * *

UNITED STATES PATENT AND TRADEMARK OFFICE
CERTIFICATE OF CORRECTION

PATENT NO.       : 10,191,807 B2
APPLICATION NO.  : 15/644132
DATED            : January 29, 2019
INVENTOR(S)      : Sung-Eun Lee et al.

It is certified that error appears in the above-identified patent and that said Letters Patent is hereby corrected as shown below:

On the Title Page

Item (54)
Replace "MEMORY SYSTEMS AND OPERATION METHOD THEREOF" with --MEMORY SYSTEM AND OPERATION METHOD THEREOF--

Signed and Sealed this
Twelfth Day of March, 2019

Andrei Iancu
*Director of the United States Patent and Trademark Office*